(12) United States Patent
Bonifield et al.

(10) Patent No.: US 11,069,627 B2
(45) Date of Patent: Jul. 20, 2021

(54) SCRIBE SEALS AND METHODS OF MAKING

(71) Applicant: Texas Instruments Incorporated, Dallas, TX (US)

(72) Inventors: Thomas D. Bonifield, Dallas, TX (US); Jeffrey A. West, Dallas, TX (US); Byron Williams, Plano, TX (US); Honglin Guo, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 195 days.

(21) Appl. No.: 14/854,896

(22) Filed: Sep. 15, 2015

(65) Prior Publication Data

US 2016/0133580 A1 May 12, 2016

Related U.S. Application Data

(60) Provisional application No. 62/076,299, filed on Nov. 6, 2014.

(51) Int. Cl.

| H01L 23/544 | (2006.01) |
|---|---|
| H01L 23/00 | (2006.01) |
| H01L 23/58 | (2006.01) |
| H01L 23/31 | (2006.01) |
| H01L 23/62 | (2006.01) |

(52) U.S. Cl.
CPC ........ *H01L 23/562* (2013.01); *H01L 23/3171* (2013.01); *H01L 23/585* (2013.01); *H01L 23/62* (2013.01); *H01L 2224/05554* (2013.01); *H01L 2224/48091* (2013.01); *H01L 2224/48137* (2013.01); *H01L 2224/48465* (2013.01); *H01L 2224/48471* (2013.01); *H01L 2224/48479* (2013.01); *H01L 2924/00014* (2013.01); *H01L 2924/3862* (2013.01)

(58) Field of Classification Search
CPC . H01L 23/562; H01L 23/585; H01L 23/3171; H01L 2224/48137
USPC ................................ 257/619–624, 438, 462
See application file for complete search history.

(56) References Cited

U.S. PATENT DOCUMENTS

| 5,530,280 | A | * | 6/1996 | White | H01L 23/562 |
| | | | | | 257/508 |
| 5,831,330 | A | * | 11/1998 | Chang | H01L 23/585 |
| | | | | | 257/620 |
| 6,521,975 | B1 | | 2/2003 | West et al. | |
| 7,977,232 | B2 | * | 7/2011 | Eto | H01L 23/585 |
| | | | | | 438/622 |
| 2006/0065953 | A1 | * | 3/2006 | Kim | H01L 23/3192 |
| | | | | | 257/620 |

(Continued)

*Primary Examiner* — Nitin Parekh
(74) *Attorney, Agent, or Firm* — Rose Alyssa Keagy; Charles A. Brill; Frank D. Cimino

(57) ABSTRACT

A semiconductor die includes a plurality of layers, the plurality of layers having a top surface. A scribe seal is located in the plurality of layers and includes a first metal stack having a first metal layer located proximate the top surface. A trench is located in at least one layer of the plurality of layers. The trench extends from the top surface of the plurality of layers and is located a distance from the first metal stack. An electrical insulating layer is located on the top surface. The electrical insulating layer covers at least a portion of the top surface adjacent the first metal layer and extends a distance from the top surface of the first metal layer.

20 Claims, 2 Drawing Sheets

(56) References Cited

U.S. PATENT DOCUMENTS

| | | | |
|---|---|---|---|
| 2010/0013043 A1* | 1/2010 | Liu | H01L 23/585 |
| | | | 257/491 |
| 2010/0078769 A1* | 4/2010 | West | H01L 23/562 |
| | | | 257/620 |
| 2010/0181681 A1* | 7/2010 | Akiba | H01L 21/78 |
| | | | 257/773 |
| 2012/0322242 A1* | 12/2012 | Lei | H01L 21/78 |
| | | | 438/462 |
| 2015/0060956 A1* | 3/2015 | Chen | G01L 9/0045 |
| | | | 257/254 |
| 2015/0104929 A1* | 4/2015 | Lei | H01L 21/3065 |
| | | | 438/462 |

* cited by examiner

SCRIBE SEALS AND METHODS OF MAKING

This application claims priority to U.S. Provisional Patent Application 62/076,299 for METHOD FOR PREVENTING BREAKDOWN BETWEEN HIGH VOLTAGE WIRES BONDED TO AN ISOLATOR DEVICE AND LOW VOLTAGE REGIONS OF SAME DEVICE of Thomas Bonifield, filed on Nov. 6, 2014, which is incorporated for all that is disclosed.

BACKGROUND

A Multi-Chip Module (MCM) Small Outline Integrated Circuit (SOIC) package contains different dies within the package. Electrical connections between different dies within a MCM include bond wires connected between components on the different dies. A common bonding technique applies a ball bond to a first component on a first die and a stitch bond to a second component on a second die. The configuration of the stitch bond causes a low angle between the surface of the second component and the bond wire at the location of the stitch bond, causing the bond wire to be located close to the surface of the die. In high voltage applications, the close proximity of the bond wire to the surface of the die results in a high electric field that can lead to premature breakdown of isolation material located between the bond wire and the surface of the die, causing a short circuit between the bond wire and the surface, which may result in failure of the IC in which the die is located.

Some dies have a scribe seal located near the die edges, which serves to prevent cracks incurred during die singulation from propagating through the dies. Typical scribe seal designs consist of stacked, electrically grounded metal layers which may be exposed to the top surface of the die. Accordingly, MCM SOICs containing high voltage components will have high voltage wires, such as bond wires, that necessarily extend over the die edges and the exposed grounded scribe seal, resulting in a high electric field that can lead to breakdown of the isolation in these regions that leads to failures of the ICs. Some high voltage IC requirements specify that the devices must withstand voltages of greater than 1000 Vrms for periods greater than 37 years and withstand surge voltages of up to 10 kVpeak. The strong electric fields produced by the proximity of the low voltage conductors and the bond wires may not meet the stringent requirements.

SUMMARY

A semiconductor die includes a plurality of layers wherein the plurality of layers has a top surface. A scribe seal is located in the plurality of layers and includes a first metal stack having a first metal layer located proximate the top surface. A trench is located in at least one layer of the plurality of layers. The trench extends from the top surface of the plurality of layers and is located a distance from the first metal stack. An electrical insulating layer is located on the top surface. The electrical insulating layer covers at least a portion of the top surface adjacent the first metal layer and extends a distance from the top surface of the first metal layer.

DETAILED DESCRIPTION

Figure 1:
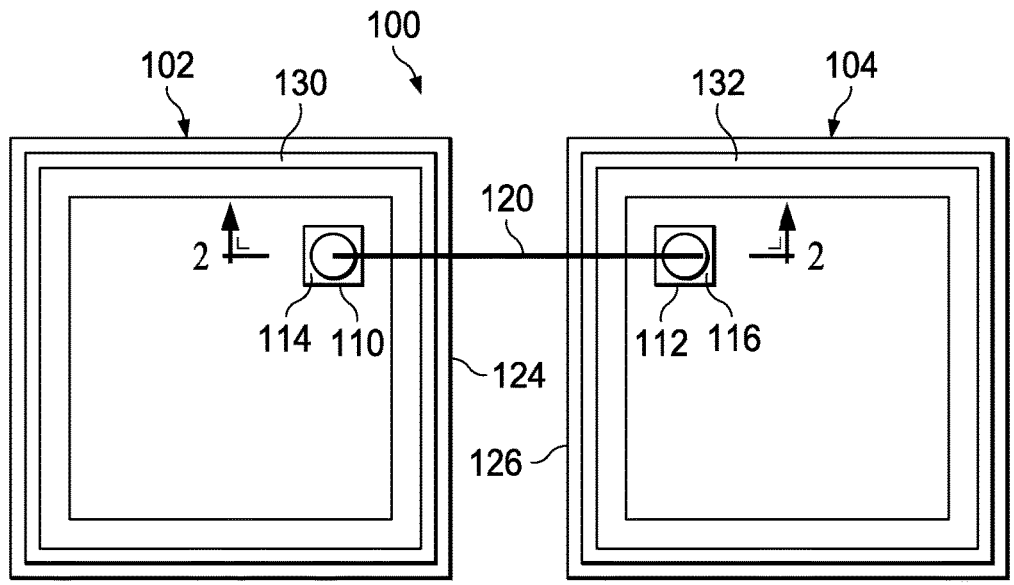
FIG. 1 is a top plan view of an integrated circuit having a first die and a second die located thereon.

Integrated circuits (ICs) and dies that are capable of sustaining high voltages are described herein. FIG. 1 is a top plan view of an integrated circuit 100 having a first die 102 and a second die 104 located thereon. The integrated circuit 100 and the components located thereon are not necessarily drawn to scale for illustration purposes. The first die 102 has a bond pad 110 located thereon and the second die 104 has a bond pad 112 located thereon. The bond pad 110 has a bond surface 114 that is configured to receive a bond wire and the bond pad 112 has a bond surface 116 that is also configured to receive a bond wire. A bond wire 120 is bonded to both the bond surface 114 and the bond surface 116 to electrically connect or couple the first die 102 and the second die 104. In the example of FIG. 1, the bond pads 110 and 112 are conductive plates of isolation capacitors and the bond wire 120 operates at a high voltage potential relative to ground or other voltage potentials in the integrated circuit 100. In some embodiments, the isolation capacitors are galvanic capacitors or galvanic isolators. In other examples, the bond pads 110 and 112 may be portions of other electronic devices or conductive portions of the dies 102 and 104.

The first die 102 has an edge 124 and the second die 104 has an edge 126 that faces the edge 124 of the first die 102. The edges 124 and 126 are formed by a sawing process or other singulation process when the dies 102 and 104 are singulated from a larger wafer or the like. It is noted that all the edges of both dies 102 and 104 are cut in a similar manner and the edges 124 and 126 described herein are representative of all the edges on both dies 102 and 104. The first die 102 has a scribe seal 130 formed therein and the second die 104 has a scribe seal 132 formed therein, wherein both scribe seals 130 and 132 are similar or identical. The scribe seals 130 and 132 prevent cracks incurred during singulation from propagating through the dies 102 and 104. For example, the dies 102 and 104 are susceptible to cracking during the singulation process when a saw separates the dies 102 and 104 from the wafers or other material from which they were fabricated. In the example of FIG. 1, the scribe seals 130 and 132 are shown as rings that are located in close proximity to the edges 124 and 126 of the dies 102 and 104, respectively. As described below, the scribe seals 130 and 132 are complex structures fabricated into the dies 102 and 104 that prevent cracks from propagating through the dies 102 and 104.

Figure 2:
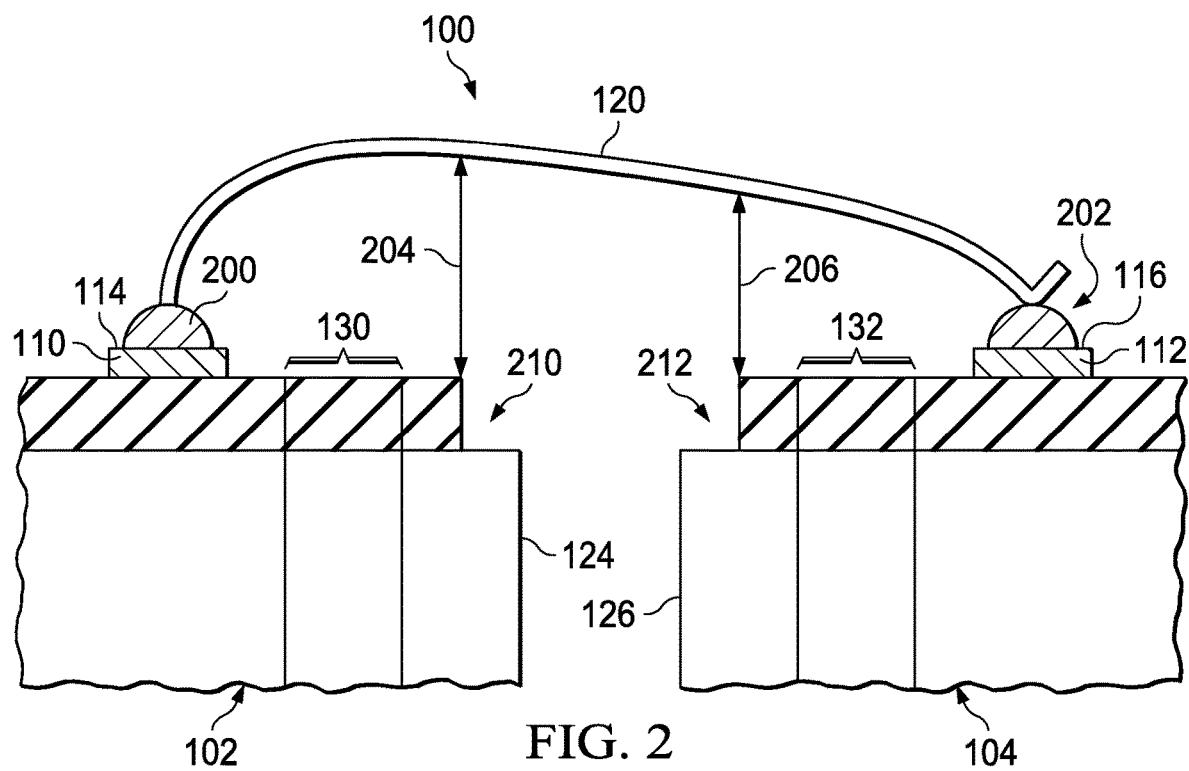
FIG. 2 is a side cut-away view of a portion of the integrated circuit of FIG. 1.

FIG. 2 is a side cut-away view of a portion of the integrated circuit 100 of FIG. 1. In the embodiment of FIG. 2, the bond wire 120 is bonded to the bond surface 114 of the bond pad 110 on the first die 102 by a ball bond 200. The bond wire 120 is bonded to the bond surface 116 of the bond pad 112 on the second die 104 by a stitch bond 202. With reference to the ball bond 200, the bond wire 120 intersects the bond pad 110 at a very steep angle, so the bond wire 120 extends substantially normal to the surface of the first die 102 and is located far from the first die 102. In the example of FIG. 2, the bond wire 120 is located a distance 204 from the surface of the first die 102. In some examples, the distance 204 is approximately 250 um, however, the distance 204 may vary depending on such factors as the wire composition and diameter, the distance between the dies 102 and 104, the bonding parameters employed to bond the bond wire 120 to the bond pads 110 and 112, as well as the distance between the bond pads 110 and 112 and the scribe seals 130 and 132.

The bond wire 120 intersects the second conductive pad 112 at a low angle relative to the bond surface 116 of the second conductive pad 112. In conventional integrated circuits, the low angle at the intersection of the bond wire 120 and the bond surface 116 places the bond wire 120 in close proximity to conducting components (not shown) in the second die 104. The configuration of the wire and the low angle causes the bond wire 120 to be located a distance 206 from the surface of the second die 104. However, the bond wire 120 is located very close to the second die 104 proximate the stitch bond 202. Certain shaping of the bond wire 120 may increase the distance 206. However, these increased distances between the bond wire 120 and the second die 104 may not be great enough to achieve sufficient isolation between the bond wire 120 and the second die 104 to ensure meeting specified product lifetime high voltage operating requirements.

Prior to singulation of the first die 102 and the second die 104, the wafers from which they are fabricated are scribed to reduce the probability of cracks forming in the dies 102 and 104 during subsequent sawing or cutting processes. The scribe forms a trench in the overlying protective dielectric layers on the wafer, which yields a ledge 210 in the first die 102 and a ledge 212 in the second die 104 after the singulation process. The trench in the wafer is typically wider than the saw blade used to cut the wafer into the individual dies, so the ledges 210 and 212 remain after the wafer is cut. The scribe coupled with the cut made by the saw forms the edges 124 and 126, which are sometimes referred to as the saw kerfs.

Figure 3:
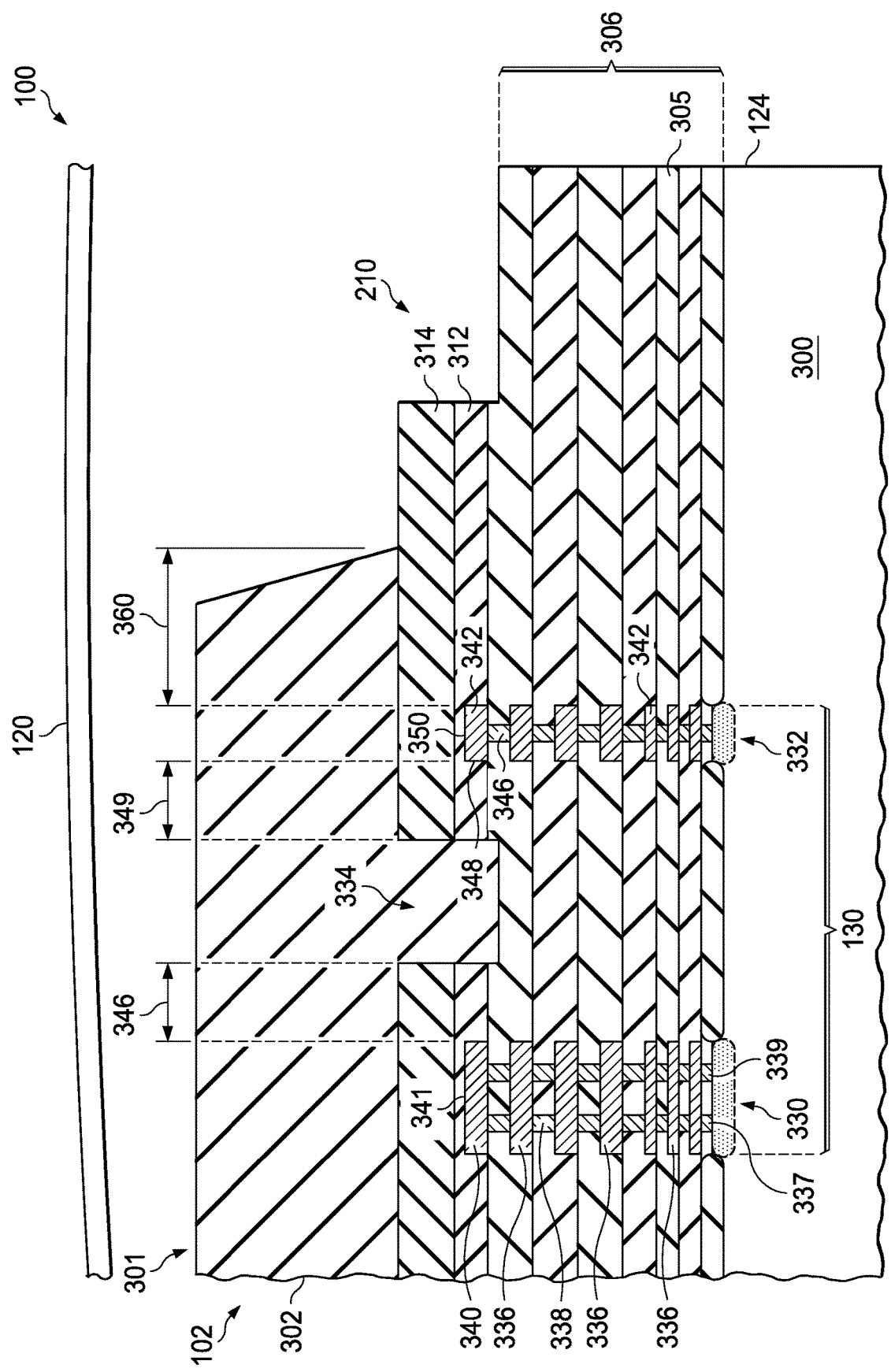
FIG. 3 is a side cut-away exploded view of a portion of the integrated circuit of FIG. 1 showing a scribe seal.

FIG. 3 is a detailed cut-away view of a portion of the integrated circuit 100 showing the scribe seal 130 in the first die 102. The scribe seal 132 in the second die 104 is identical or substantially similar to the scribe seal 130 described below. The first die 102 has a substrate 300 having a plurality of layers 301 formed thereon. The layers 301 in the die 102 are examples of an embodiment of the die 102, wherein other examples may include different layers. A top layer is a sealing layer 302, which in some examples is a polyimide layer or a polybenzoxazole (PBO) layer. In some examples, the sealing layer 302 has dielectric characteristics that provide for a breakdown strength of approximately 300V/um. The sealing layer 302 extends to the edges of the scribe seal 130. A layer 305 is an example of an inter-layer dielectric (ILD), wherein the layers 301 may include a plurality of ILD layers 306, such as a plurality of silicon dioxide ($SiO_2$) layers. A layer 312 is a protective overcoat that may be an oxide layer. In some examples, the layer 312 is referred to as a passivation oxide. A layer 314 is also a protective overcoat, such as silicon oxynitride (SiON) or silicon nitride (SiN). In some examples, the layer 314 is a material that has high electrical insulating properties, which are greater than the insulting properties of a mold compound (not shown) that encloses the integrated circuit 100. In other examples, the layer 312 and the layer 314 are combined into a single layer that has high insulating properties, such as higher insulating properties than the above-described mold compound. For example, the mold compound may have a breakdown strength of approximately 120V/um, so the layers 312 and/or 314 may have higher breakdown strengths than 120V/um.

The scribe seal 130 is formed in at least some of the layers 301 and serves to prevent cracks from propagating through the layers 301, such as during singulation. During the sawing process in singulation, cracks can form at the edge 124 of the die 102 and propagate laterally toward the scribe seal 130. The scribe seal 130 serves to arrest the propagation of cracks. The scribe seal 130 includes a first metal stack 330 and a second metal stack 332. A unique feature of the scribe seal 130 described herein is that high breakdown strength dielectric material, such as the layer 312 and/or the layer 314, covers the first and second metal stacks 330 and 332. The layers 312 and/or 314 provide additional isolation to reduce the effects of high voltage potentials between the bond wire 120 and the metal stacks 330 and 320, which are typically at ground or a low voltage potential relative to the bond wire 120. A trench 334 is formed in the layers 301, such as during a protective overcoat removal step in the fabrication of the die 102. The trench 334 is located between the first metal stack 330 and the second metal stack 332.

The first metal stack 330 includes a plurality of metal layers 336 that are located in some or all of the layers 301. In the example of FIG. 3, the metal layers 336 are located in the ILD layers 306, which has seven layers. Conductors 338, which may be small openings or die-circumscribing trenches, electrically connect the metal layers 336 to each other. The first metal stack 330 contains conductors 338 that are in two groups, an interior group 337 and an exterior group 339. The interior group 337 may be long trenches that fully circumscribe the die 102. The interior group 337 forms a solid wall of metal that prevents entry of moisture, contamination, and cracks. In some embodiments, the exterior group 339 includes vias that electrically connect the conductors 338. The conductors 338 further connect the metal layers 336 to a common node, such as ground. The first metal stack 330 has a top metal layer 340, which has a surface 341 that faces the bond wire 120. The top metal layer 340 is the metal layer that is closest to the bond wire 120 and is at a low potential, such as ground, relative to the bond wire 120. In the example of FIG. 3, the first metal stack 330 is approximately 5.6 um wide; however, its width may vary depending on the application.

The second metal stack 332 is similar to the first metal stack 330, but in some embodiments, it may be narrower, such as 2.8 um wide. The second metal stack 332 includes a plurality of metal layers 342. The metal layers 342 are located in the layers 301, including the ILD layers 306, so the number of metal layers 342 may be equal to the number of metal layers 336 in the first metal stack 330. The metal layers 342 are electrically connected to each other by way of a plurality of conductors 346, which also connect the metal layers 342 to a potential, such as ground. In some examples, the conductors 346 are vias and in other examples the conductors 346 are trenches that circumscribe the die 102 The metal layers 342 may be electrically connected to the same potential, such as ground, as the metal layers 336. The second metal stack 332 has a top metal layer 348 that has a top surface 350. The top metal layer 348 is the metal layer in the second metal stack 332 that is closest to the bond wire 120.

The trench 334 extends into the plurality of layers 301 between the first metal stack 330 and the second metal stack 332. In the example of FIG. 3, the trench 334 is approximately Sum wide; however, the width of the trench 334 may vary depending on the application. The trench 334 serves to stop cracks that propagate through layers 312 and/or 314 over the top metal layer 348 in the second metal stack 332 from also propagating over the top metal layer 340 in first metal stack 330. In conventional scribe seals, a trench or the like is located above a metal stack, so the material filling the trench, such as polyimide, separates the metal in the metal stack from the bond wire. The material used in the trench is a sealant type material and typically has relatively low insulating and dielectric properties, so electrical breakdown may occur between the bond wire 120 and top surfaces of the metal stacks in the conventional devices.

The metal stacks 330 and 332 described herein are covered by the layer 312 and the layer 314, which in some examples, have better insulating and dielectric characteristics than the sealing layer 302, so the integrated circuit 100 can operate at higher voltages or over a longer lifetime. More specifically, the bond wire 120 can conduct higher voltages than in conventional integrated circuits. In the example of FIG. 3, the layer 314 is approximately 2.8 um thick. The layer 314 extends a distance 346 between the trench 334 and the first metal stack 330 and a distance 349 between the trench 334 and the second metal stack 332. The distances 346 and 349 may be approximately 4.6 um, but the distances 346 and 349 may vary depending on the application. The sealing layer 302 extends or overlaps a distance 360 from the second stack 332. As described above, the dielectric properties of the sealing layer 302 are greater than those of a mold compound, so the sealing layer 302 extending the distance 360 further reduces the chances of electrical breakdown between the bond wire 120 and the scribe seal 130.

During singulation, cracks may originate at the edge 124 of the die 102. Most cracks will propagate laterally and will terminate at the second metal stack 332. More specifically, the metal layers 342 and connections 346 in the second metal stack 332 are able to absorb the energy of most cracks and terminate their propagation. In some situations, a crack will propagate between the surface 350 of the top metal layer 348 and the layer 314. The propagating crack will encounter the trench 334 where the energy of the propagating crack will be absorbed by the material in the trench 334. For example, if the material in the trench is a polyimide, it is relatively flexible and will absorb the energy of the propagating crack to prevent it from propagating further.

Unlike conventional scribe seals, the scribe seal 130 provides an insulating material between the top metal layers 340 and 348 and the bond wire 120. As described above, conventional scribe seals have the trench fabricated above or on the top surface of a top metal layer. Accordingly, there is no good insulating material between a metal stack and a bond wire in conventional scribe seals.

The above described integrated circuit 100 has many advantages over conventional integrated circuits. For example, low voltage components, such as the metal stacks 330 and 332, may be located proximate the surface of the dies 102 and 104. The heights 204 and 206, FIG. 2, of the bond wire 120 can have more variation than in conventional integrated circuits. For example, the additional insulating properties of the layers 312 and 314 enables the bond wire 120 to be located closer to the dies 102 and 104. When the heights 204 and 206 are lower, the amount of wire sweep during mold injection processes, which contributes to a reduction in the eventual wire bond heights 204 and 206, is reduced.

While some examples of semiconductor fabrication have been described in detail herein, it is to be understood that the inventive concepts may be otherwise variously embodied and employed and that the appended claims are intended to be construed to include such variations except insofar as limited by the prior art.

What is claimed is:

1. A semiconductor die, comprising:
   a plurality of layers including a first layer, the first layer having a top surface;
   a scribe seal formed in at least one layer of the plurality of layers, the scribe seal including a metal stack having a first metal layer, located proximate the top surface of the first layer; and
   a trench that is entirely filled with a sealant formed in at least one layer of the plurality of layers, the trench extending below a plane corresponding to a top surface of the first metal layer and the trench laterally separated from the first metal layer.

2. The semiconductor die of claim 1; further comprising:
   an electrical insulating layer formed on the top surface of the first layer, the electrical insulating layer covering at least a portion of the top surface of the first layer adjacent the first metal layer and extending a distance laterally from a location of the first metal layer.

3. The semiconductor die of claim 2, wherein the electrical insulating layer covers the top surface of the first metal layer.

4. The semiconductor die of claim 2, wherein the electrical insulating layer is at least partially located between the trench and the metal stack.

5. The semiconductor die of claim 2, wherein the metal stack is a first metal stack and wherein the scribe seal further comprises a second metal stack, wherein the trench is located between the first metal stack and the second metal stack.

6. The semiconductor die of claim 5, wherein the electrical insulating layer is at least partially located between the second metal stack and the trench.

7. The semiconductor die of claim 5, wherein the second metal stack has a surface located proximate the top surface of the first layer and wherein the electrical insulating layer covers the surface of the second metal stack.

8. The semiconductor die of claim 5, wherein the trench extends into the plurality of layers beneath a plane corresponding to a bottom surface of a first metal layer in the second metal stack.

9. The semiconductor die of claim 5, wherein the second metal stack includes a plurality of metal layers and wherein the plurality of metal layers are electrically connected to each other.

10. The semiconductor die of claim 9, wherein the plurality of metal layers of the second metal stack are electrically coupled to the first metal layer in the first metal stack.

11. The semiconductor die of claim 5, wherein the second metal stack circumscribes the semiconductor die.

12. The semiconductor die of claim 1, wherein the semiconductor die has an edge and wherein the metal stack is located between the edge and the trench.

13. The semiconductor die of claim 1, wherein the trench extends into the plurality of layers beneath a plane corresponding to a bottom surface of the first metal layer.

14. The semiconductor die of claim 1, wherein the metal stack includes a plurality of metal layers and wherein the plurality of metal layers are electrically connected to each other.

15. The semiconductor die of claim 14, wherein the plurality of metal layers are electrically coupled to a ground node.

16. The semiconductor die of claim 1, wherein the metal stack circumscribes the semiconductor die.

17. A semiconductor die, comprising:
   a plurality of layers including a first layer, the first layer having a top surface;

a scribe seal formed in at least one layer of the plurality of layers, the scribe seal including:
  a first metal stack having a first metal layer located proximate the top surface of the first layer; and
  a second metal stack having a second metal layer located proximate the top surface of the first layer; and
a trench that is entirely filled with a sealant formed in at least one layer of the plurality of layers, the trench formed between a top surface of the first metal stack and a top surface of the second metal stack, and a bottom of the trench in direct contact with an inter-layer dielectric.

18. The semiconductor die of claim 17; further comprising an electrical insulating layer formed on the top surface of the first layer, the electrical insulating layer covering at least a portion of the top surface of the first layer adjacent the first metal layer and the second metal layer, wherein the insulating layer extends a distance laterally from a location of the first metal layer and a location of the second metal layer.

19. The semiconductor die of claim 17, wherein the trench extends below a plane corresponding to a top surface of the first metal layer of the first metal stack.

20. A semiconductor die, comprising:
a plurality of layers including a first layer, the first layer having a top surface;
a scribe seal formed in at least one layer of the plurality of layers, the scribe seal including:
  a first metal stack having a first metal layer located proximate the top surface of the first layer;
  a second metal stack having a second metal layer located proximate the top surface of the first layer; and
  a trench that is entirely filled with a sealant formed in at least one layer of the plurality of layers, the trench extending below a plane corresponding to a top surface of the first metal layer of the first metal stack and the trench laterally separated from the first metal layer.

* * * * *